(12) United States Patent
Miyakura et al.

(10) Patent No.: US 10,262,872 B2
(45) Date of Patent: Apr. 16, 2019

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Takahiro Miyakura, Toyama (JP); Atsushi Moriya, Toyama (JP); Naoharu Nakaiso, Toyoma (JP); Kensuke Haga, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/665,698

(22) Filed: Aug. 1, 2017

(65) Prior Publication Data

US 2018/0040475 A1 Feb. 8, 2018

(30) Foreign Application Priority Data

Aug. 2, 2016 (JP) .................. 2016-151950

(51) Int. Cl.
*H01L 21/3205* (2006.01)
*C30B 25/06* (2006.01)
(Continued)

(52) U.S. Cl.
CPC ...... *H01L 21/32055* (2013.01); *C23C 16/045* (2013.01); *C23C 16/24* (2013.01); *C23C 16/30* (2013.01); *C23C 16/45523* (2013.01); *C23C 16/45531* (2013.01); *C23C 16/45534* (2013.01); *C23C 16/52* (2013.01); *C23C 16/56* (2013.01); *C30B 25/005* (2013.01); *C30B 25/02* (2013.01); *C30B 25/06* (2013.01);
(Continued)

(58) Field of Classification Search
None
See application file for complete search history.

(56) References Cited

U.S. PATENT DOCUMENTS

2003/0139012 A1 7/2003 Yamauchi et al.
2007/0287272 A1* 12/2007 Bauer ............... H01L 21/02529
438/485

(Continued)

FOREIGN PATENT DOCUMENTS

JP 2003-218036 A 7/2003
JP 2003-218037 A 7/2003
(Continued)

OTHER PUBLICATIONS

H. Xiao, Introduction to Semiconductor Manufacturing Technology, published by Prentice Hall, year 2001, ISBN 0-13-022404-9, pp. 355.*

(Continued)

*Primary Examiner* — Jiong-Ping Lu
(74) *Attorney, Agent, or Firm* — Volpe and Koenig, P.C.

(57) ABSTRACT

There is provided a method of manufacturing a semiconductor device. The method includes: forming a first amorphous silicon film on a substrate in a process chamber; and etching a portion of the first amorphous silicon film using a hydrogen chloride gas under a temperature at which an amorphous state of the first amorphous silicon film is maintained, in the process chamber.

17 Claims, 8 Drawing Sheets

(51) Int. Cl.
  *H01L 21/02* (2006.01)
  *H01L 29/66* (2006.01)
  *C30B 25/00* (2006.01)
  *C30B 25/02* (2006.01)
  *C23C 16/30* (2006.01)
  *C23C 16/455* (2006.01)
  *C23C 16/04* (2006.01)
  *C23C 16/24* (2006.01)
  *C23C 16/52* (2006.01)
  *C23C 16/56* (2006.01)

(52) U.S. Cl.
  CPC .. *H01L 21/02126* (2013.01); *H01L 21/02164* (2013.01); *H01L 21/02233* (2013.01); *H01L 21/02636* (2013.01); *H01L 29/66636* (2013.01)

(56) References Cited

U.S. PATENT DOCUMENTS

2008/0138964 A1* 6/2008 Ye ................ H01L 21/02529
                                                438/478
2009/0075029 A1* 3/2009 Thomas ............ H01L 21/02381
                                                428/173
2014/0199824 A1   7/2014 Komori
2014/0273379 A1* 9/2014 Tsai ................ H01L 29/66795
                                                438/283
2015/0303051 A1  10/2015 Takeda

FOREIGN PATENT DOCUMENTS

KR    20090030226 A    3/2009
KR    20140093180 A    7/2014

OTHER PUBLICATIONS

Taiwanese Office Action dated Jun. 29, 2018 for the Taiwanese Patent Application No. 106123803.
Korean Office Action dated Oct. 22, 2018 for the Korean Patent Application No. 10-2017-0097486.

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2016-151950, filed on Aug. 2, 2016, the entire contents of which are incorporated herein by reference.

TECHNICAL FIELD

The present disclosure relates to a method of manufacturing a semiconductor device, a substrate processing apparatus, and a recording medium.

BACKGROUND

One process of manufacturing a semiconductor device that is often used is a process of forming a silicon film (Si film) on a substrate.

SUMMARY

Some embodiments of the present disclosure provide a technique capable of improving the quality of a Si film formed on a substrate.

According to one embodiment of the present disclosure, there is provided a method of manufacturing a semiconductor device, including: forming a first amorphous silicon film on a substrate in a process chamber: and etching a portion of the first amorphous silicon film using a hydrogen chloride gas under a temperature at which an amorphous state of the first amorphous silicon film is maintained, in the process chamber.

DETAILED DESCRIPTION

One Embodiment of the Present Disclosure

One embodiment of the present disclosure will now be described with reference to FIGS. 1 to 3.

(1) Configuration of the Substrate Processing Apparatus

Figure 1:
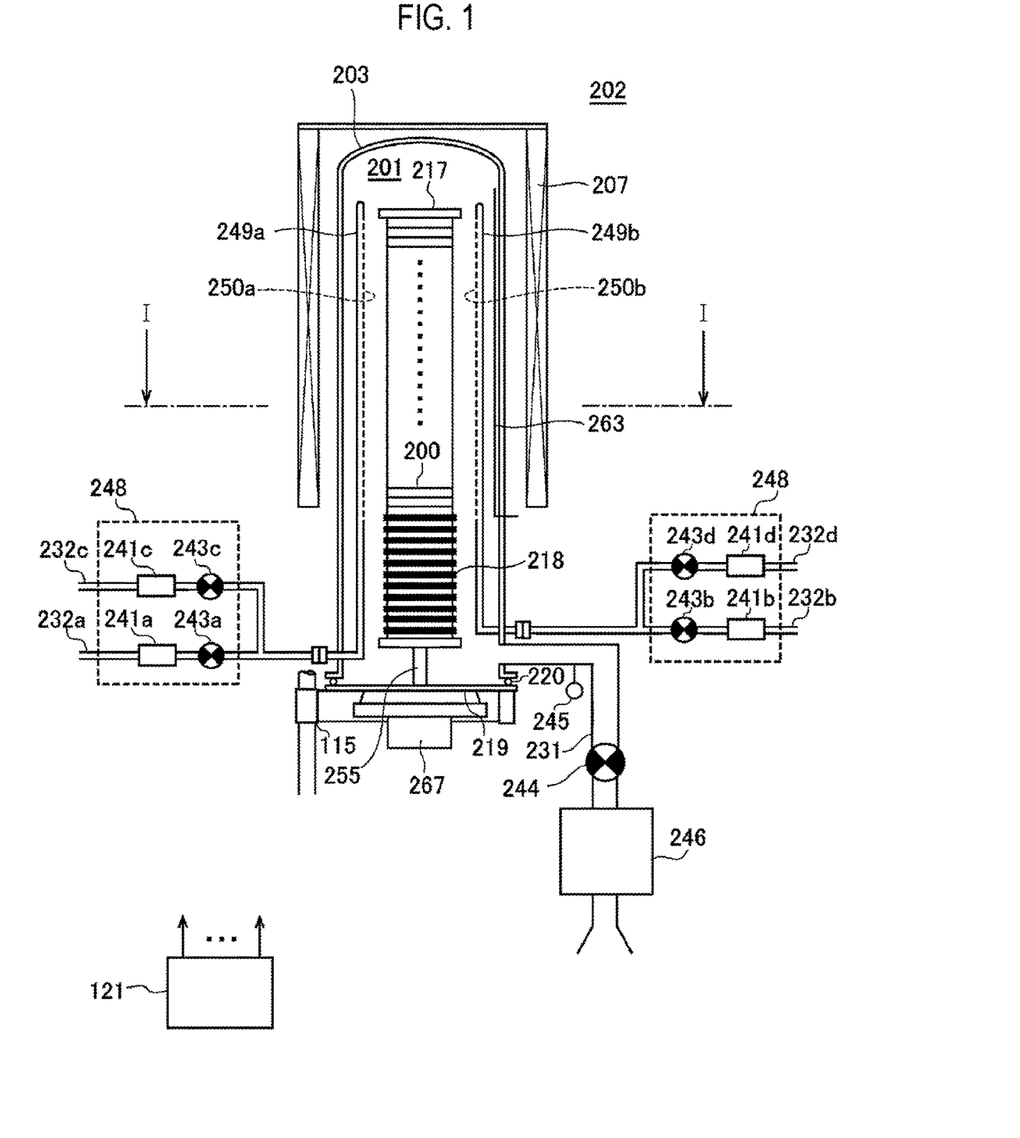
FIG. 1 is a schematic configuration diagram of a vertical type processing furnace of a substrate processing apparatus suitably used in one embodiment of the present disclosure, in which a portion of the processing furnace is shown in a vertical cross sectional view.

As illustrated in FIG. 1, a processing furnace 202 includes a heater 207 as a heating part (heating mechanism). The heater 207 has a cylindrical shape and is supported by a retaining plate so as to be vertically installed. The heater 207 functions as an activation mechanism (an excitation part) configured to thermally activate (excite) a gas.

A reaction tube 203 constituting a reaction vessel (process vessel) is disposed inside the heater 207 to be concentric with the heater 207. The reaction tube 203 is made of a heat resistant material such as, e.g., quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate wafers 200 as substrates.

Nozzles 249a and 249b are installed in the process chamber 201 so as to penetrate a lower sidewall of the reaction tube 203. Gas supply pipes 232a and 232b are respectively connected to the nozzles 249a and 249b.

Mass flow controllers (MFCs) 241a and 241b, which are flow rate controllers (flow rate control parts), and valves 243a and 243b, which are opening/closing valves, are installed in the gas supply pipes 232a and 232b sequentially from the corresponding upstream sides, respectively. Gas supply pipes 232c and 232d, which supply an inert gas, are respectively connected to the gas supply pipes 232a and 232b at the downstream sides of the valves 243a and 243b. MFCs 241c and 241d and valves 243c and 243d are respectively installed in the gas supply pipes 232c and 232d sequentially from the corresponding upstream sides.

Figure 2:
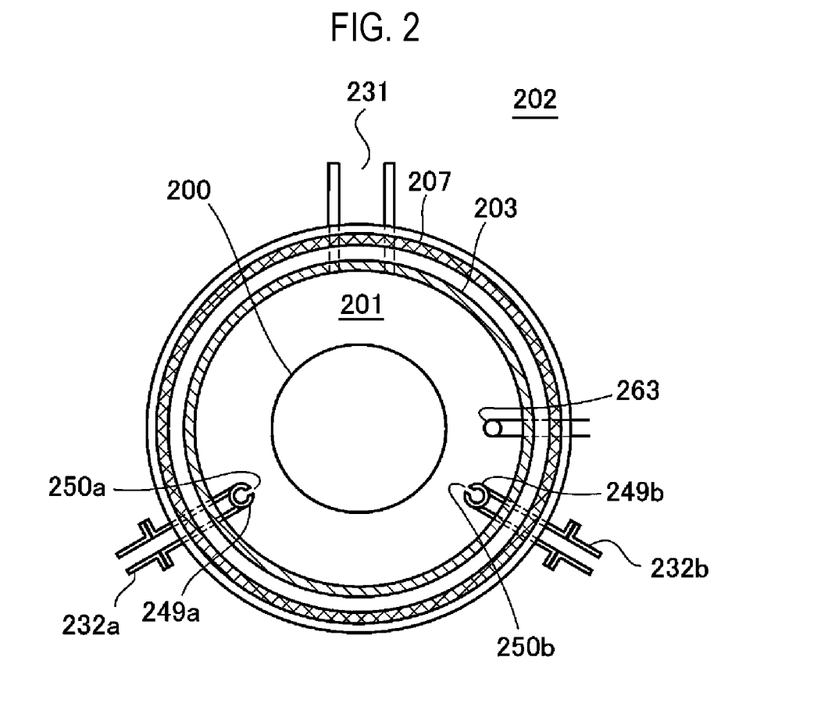
FIG. 2 is a schematic configuration diagram of the vertical type processing furnace of the substrate processing apparatus suitably used in one embodiment of the present disclosure, in which a portion of the processing furnace is shown in a cross sectional view taken along line I-I in FIG. 1.

As illustrated in FIG. 2, the nozzles 249a and 249b are disposed in a space with an annular shape in a plan view between an inner wall of the reaction tube 203 and the wafers 200 such that the nozzles 249a and 249b extend upward along an arrangement direction of the wafers 200 from a lower portion of the inner wall of the reaction tube 203 to an upper portion of the inner wall of the reaction tube 203. In other words, the nozzles 249a and 249b are installed at a lateral side of a wafer arrangement region in which the wafers 200 are arranged, namely in a region which horizontally surrounds the wafer arrangement region, so as to extend along the wafer arrangement region. Gas supply holes 250a and 250b for supplying a gas are formed on side surfaces of the nozzles 249a and 249b, respectively. The gas supply holes 250a and 250b are opened toward the center of the reaction tube 203 so as to allow a gas to be supplied toward the wafers 200. A plurality of gas supply holes 250a and 250b may be formed from a lower portion of the reaction tube 203 and to an upper portion of the reaction tube 203.

A first precursor gas, for example, a halosilane precursor gas containing silicon (Si) and a halogen element, is supplied from the gas supply pipe 232a into the process chamber 201 via the MFC 241a, the valve 243a and the nozzle 249a. The precursor gas refers to a gaseous precursor, for example, a gas obtained by vaporizing a precursor which remains in a liquid state under room temperature and atmospheric pressure, or a precursor which remains in a gas state under room temperature and atmospheric pressure. The halosilane precursor is a silane precursor having a halogen group. The halogen group includes a chloro group, a fluoro group, a bromo group, an iodine group, and the like. That is, the halogen group includes a halogen element such as chlorine (Cl), fluorine (F), bromine (Br), and iodine (I) or the like. The halosilane precursor may refer to one kind of halide. As the halosilane precursor gas, it may be possible to use, for example, a dichlorosilane ($SiH_2Cl_2$, abbreviation: DCS) gas.

A dopant gas is supplied from the gas supply pipe 232a into the process chamber 201 via the MFC 241a, the valve 243a and the nozzle 249a. As the dopant gas, it may be possible to use, for example, a phosphine ($PH_3$, abbreviation: PH) gas containing phosphorus (P) as a dopant (impurity).

An etching gas is supplied from the gas supply pipe 232a into the process chamber 201 via the MFC 241a, the valve 243a and the nozzle 249a. As the etching gas, it may be possible to use, for example, a hydrogen chloride (HCl) gas.

Second and third precursor gases, for example, a silicon hydride gas containing Si and not containing a halogen element, is supplied from the gas supply pipe 232b into the process chamber 201 via the MFC 241b, the valve 243b and the nozzle 249b. As the silicon hydride gas, it may be possible to use, for example, a monosilane ($SiH_4$, abbreviation: MS) gas or a disilane ($Si_2H_6$, abbreviation: DS) gas.

A hydrogen ($H_2$) gas as a hydrogen (H)-containing gas and a nitrogen ($N_2$) gas as an inert gas are respectively supplied from the gas supply pipes 232c and 232d into the process chamber 201 via the MFCs 241c and 241d, the valves 243c and 243d, the gas supply pipes 232a and 232b, and the nozzles 249a and 249b.

A first supply system for supplying a precursor gas is mainly configured by the gas supply pipes 232a and 232b, the MFCs 241a and 241b, and the valves 243a and 243b. Each of a second supply system for supplying an etching gas and a third supply system for supplying a dopant gas is mainly configured by the gas supply pipe 232a, the MFC 241a, and the valve 243a. A fourth supply system for supplying a hydrogen-containing gas and an inert gas supply system are mainly configured by the gas supply pipes 232c and 232d, the MFCs 241c and 241d, and the valves 243c and 243d, respectively.

Any one or all of various kinds of supply systems mentioned above may be configured as an integrated supply system 248 in which the valves 243a to 243d, the MFCs 241a to 241d, and the like are integrated. The integrated supply system 248 is connected to each of the gas supply pipes 232a to 232d, and is configured such that the supply operation of various kinds of gases into the gas supply pipes 232a to 232d, namely the opening/closing operation of the valves 243a to 243d, the flow rate adjustment operation by the MFCs 241a to 241d, and the like are controlled by a controller 121 which will be described later. The integrated supply system 248 is configured as an integral type or division type integrated unit, and can be detachable with respect to the gas supply pipes 232a to 232d, and the like on an integrated unit basis, thereby performing the maintenance, replacement, expansion, and the like of the supply system on an integrated unit basis.

An exhaust pipe 231 configured to exhaust the internal atmosphere of the process chamber 201 is installed in the reaction tube 203. A vacuum pump 246 as an exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that the vacuum exhaust of the interior of the process chamber 201 and the vacuum exhaust stop can be performed by opening and closing the APC valve 244 while operating the vacuum pump 246 and so that the internal pressure of the process chamber 201 can be adjusted by adjusting the opening degree of the APC valve 244 based on the pressure information detected by the pressure sensor 245 while operating the vacuum pump 246. An exhaust system is mainly configured by the exhaust pipe 231, the APC valve 244 and the pressure sensor 245. The vacuum pump 246 may be regarded as being included in the exhaust system.

A seal cap 219, which serves as a furnace opening cover configured to air-tightly seal a lower end opening of the reaction tube 203, is installed under the reaction tube 203. The seal cap 219 is made of metal such as, e.g., stainless steel (SUS) or the like, and is formed in a disc shape. An O-ring 220, which is a seal member making contact with the lower end portion of the reaction tube 203, is installed on an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which transfers the wafers 200 into and out of the process chamber 201 by moving the seal cap 219 up and down.

The boat 217 serving as a substrate holder is configured to hold a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as, e.g., quartz or SiC. Heat insulating plates 218 made of a heat resistant material such as, e.g., quartz or SiC are installed below the boat 217 in a horizontal posture and in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
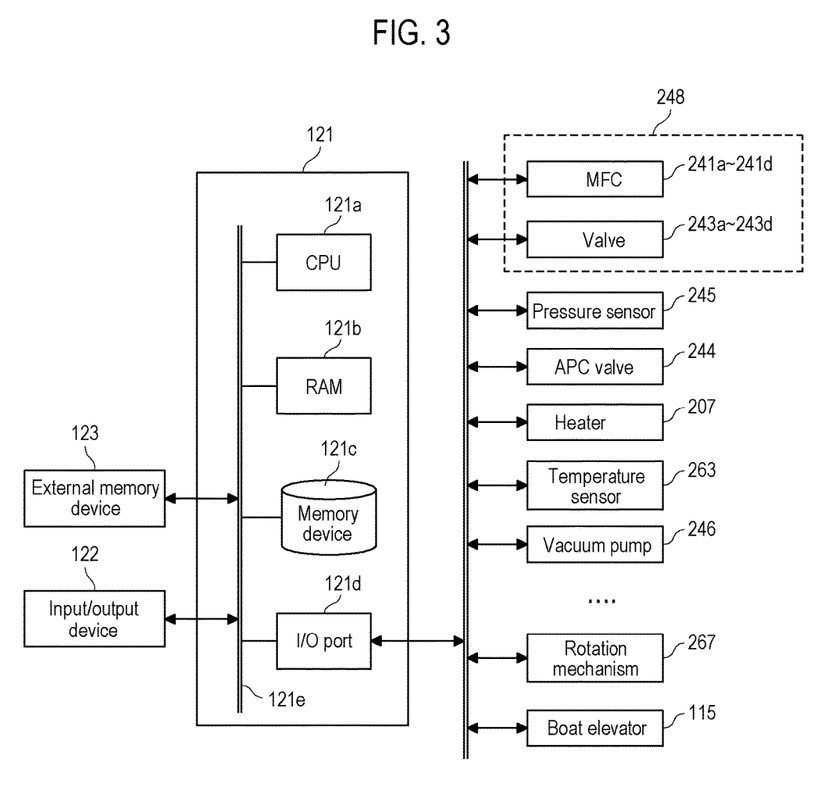
FIG. 3 is a schematic configuration diagram of a controller of the substrate processing apparatus suitably used in one embodiment of the present disclosure, in which a control system of the controller is shown in a block diagram.

As illustrated in FIG. 3, the controller 121, which is a control part (control part), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of substrate processing to be described later, or the like is readably stored in the memory device 121c. The process recipe functions as a program for causing the controller 121 to execute each sequence in a substrate processing process to be described later, to obtain a predetermined result. Hereinafter, the process recipe and the control program will be generally and simply referred to as a "program". Furthermore, the process recipe will be simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, and the like, as mentioned above.

The CPU 121a is configured to read the control program from the memory device 121c and execute the same. The CPU 121a also reads the recipe from the memory device 121c according to an input of an operation command from the input/output device 122. In addition, the CPU 121a is configured to control the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and the like, so as to carry out the contents of the read recipe.

The controller 121 may be configured by installing, on the computer, the aforementioned program stored in an external memory device 123 (for example, a magnetic disk such as a hard disk or the like, an optical disc such as a CD or the like, a magneto-optical disc such as an MO or the like, or a semiconductor memory such as a USB memory or the like). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication part such as the Internet or a dedicated line, instead of using the external memory device 123.

(2) Substrate Processing Process

Figure 4:
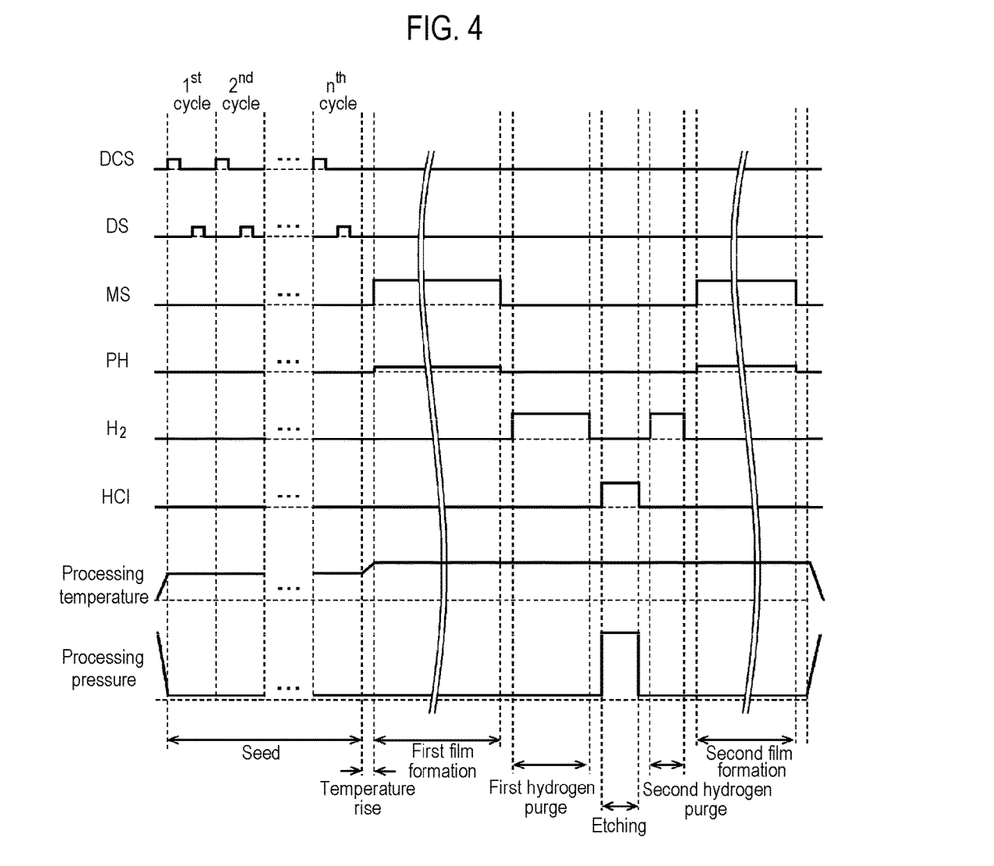
FIG. 4 is a diagram illustrating a gas supply timing in a film forming sequence according to an embodiment of the present disclosure.

A sequence example of forming a silicon film (Si film) on a wafer 200 as a substrate using the aforementioned substrate processing apparatus, which is one of the processes for manufacturing a semiconductor device, will be described below with reference to FIG. 4 and FIGS. 5A to 5E. In FIG. 4, for the sake of convenience, the illustration of the supply timing of an $N_2$ gas will be omitted. In the following descriptions, the operations of the respective parts constituting the substrate processing apparatus are controlled by the controller 121.

In the film forming sequence illustrated in FIG. 4, there are performed: a first film forming step of forming a first amorphous Si film on a wafer 200 in the process chamber 201, and an etching step of etching a portion of the first amorphous Si film using an HCl gas under a temperature at which an amorphous state of the first amorphous Si film is maintained, in the process chamber 201. In addition, thereafter, a second film forming step of forming a second amorphous Si film on the partially etched first amorphous Si film is performed in the process chamber 201.

Furthermore, in the film forming sequence mentioned above, the formation of the first and second amorphous Si films is respectively performed by supplying an MS gas and a PH gas to the wafer 200 in the process chamber 201. In addition, in the film forming sequence mentioned above, a seed step of alternately supplying a DCS gas and a DS gas to the wafer 200 in the process chamber 201 is performed before performing the first film forming step. Moreover, in the film forming sequence mentioned above, hydrogen purge steps (first and second hydrogen purge steps) of supplying an $H_2$ gas to the wafer 200 are respectively performed before and after the etching step.

When the term "wafer" is used herein, it may refer to "a wafer itself" or "a laminated body of a wafer and a predetermined layer or film formed on the surface of the wafer". In addition, when the phrase "a surface of a wafer" is used herein, it may refer to "a surface of a wafer itself" or "a surface of a predetermined layer formed on a wafer". Furthermore, in the present disclosure, the expression "a predetermined layer is formed on a wafer" may mean that "a predetermined layer is directly formed on a surface of a wafer itself" or that "a predetermined layer is formed on a layer formed on a wafer". In addition, when the term "substrate" is used herein, it may be synonymous with the term "wafer".

(Wafer Charging and Boat Loading)

A plurality of wafers 200 is charged on the boat 217 (wafer charging). Thereafter, as illustrated in FIG. 1, the boat 217 holding the plurality of wafers 200 is lifted up by the boat elevator 115 and is loaded into the process chamber 201 (boat loading). In this state, the seal cap 219 seals the lower end of the reaction tube 203 through the O-ring 220.

Figure 5A:
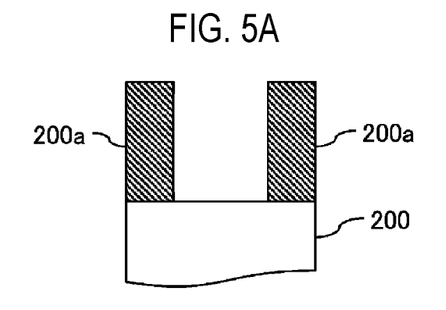
FIG. 5A is a cross sectional view illustrating a surface structure of a wafer before starting a seed step.

As the wafers 200, it may be possible to use, for example, an Si substrate formed of a single crystal Si or a substrate having a single Si film formed on its surface. As illustrated in FIG. 5A, a recess is provided on the surface of the wafer 200, a bottom portion of the recess is made of a single crystal Si, and a side portion and a top portion of the recess are made of an insulating film 200a such as a silicon oxide film (SiO film) or the like. The surface of the wafer 200 is in a state in which each of the single crystal Si and the insulating film 200a is exposed.

Before the wafer 200 is loaded into the process chamber 201, the surface of the wafer 200 is cleaned in advance with hydrogen fluoride (HF) or the like. However, the surface of the wafer 200 is temporarily exposed to the air until the wafer 200 is loaded into the process chamber 201 after the cleaning process. Thus, a natural oxide film (SiO film) is formed at least on a portion of the surface of the wafer 200 loaded into the process chamber 201. The natural oxide film may be formed to sparsely (in an island shape) cover the bottom portion of the recess, namely a portion of the exposed single crystal Si, or to continuously (in a non-island shape) cover the entire region of the exposed single crystal Si in some cases.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. Furthermore, the interior of the process chamber 201 is heated by the heater 207 such that the wafers 200 in the process chamber 201 reach a desired processing temperature. In this operation, the state of supplying electric power to the heater 207 is feedback-controlled based on the temperature information detected by the temperature sensor 263 such that the interior of the process chamber 201 has a desired temperature distribution. Next, the rotation of the wafers 200 by the rotation mechanism 267 begins. The exhaust and heating of the interior of the process chamber 201 and the rotation of the wafers 200 may be continuously performed at least until the processing of the wafers 200 is completed.

(Seed Step)

Thereafter, the following steps 1 and 2 are sequentially performed.

[Step 1]

At this step, a DCS gas is supplied to the wafer 200. Specifically, the valve 243a is opened to allow a DCS gas to flow through the gas supply pipe 232a. The flow rate of the DCS gas is adjusted by the MFC 241a. The DCS gas is supplied into the process chamber 201 via the nozzle 249a and is exhausted from the exhaust pipe 231. At this time, the DCS gas is supplied to the wafer 200. Simultaneously, the valve 243c is opened to allow an $N_2$ gas to flow through the gas supply pipe 232c. The flow rate of the $N_2$ gas is adjusted by the MFC 241c. The $N_2$ gas is supplied into the process chamber 201 together with the DCS gas and is exhausted from the exhaust pipe 231. Furthermore, in order to prevent the DCS gas from entering the nozzle 249b, the valve 243d is opened to allow the $N_2$ gas to flow through the gas supply pipe 232d. The $N_2$ gas is supplied into the process chamber 201 via the gas supply pipe 232b and the nozzle 249b and is exhausted from the exhaust pipe 231.

By supplying the DCS gas containing Cl having high electronegativity to the wafer 200, an Si—O bond contained in the natural oxide film can be broken at the bottom portion of the recess, namely on the single crystal Si, to remove the natural oxide film. Thus, a dangling bond such as a Si covalent bond is generated at the bottom portion of the recess making it possible to prepare an environment where an epitaxial growth is likely to proceed. Furthermore, an Si—O bond contained in the surface of the insulating film 200a can be broken at the side portion and the top portion of the recess, namely on the insulating film 200a. Thus, it is possible to form a dangling bond of Si, i.e., an Si adsorption site, on the surface of the insulating film 200a.

Thereafter, the valve 243a is closed to stop the supply of the DCS gas. At this time, the interior of the process chamber 201 is exhausted by the vacuum pump 246 while opening the APC valve 244. At this time, the supply of the $N_2$ gas into the process chamber 201 is maintained while opening the valves 243c and 243d. The $N_2$ gas acts as a purge gas.

[Step 2]

After step 1 is completed, a DS gas is supplied to the wafer 200. At this step, the opening/closing control of the valves 243b to 243d is performed in the same procedure as the opening/closing control of the valves 243a, 243c and 243d at step 1 to allow a DS gas to flow through the gas supply pipe 232b. The flow rate of the DS gas flowing through the gas supply pipe 232b is adjusted by the MFC 241b. The DS gas is supplied into the process chamber 201 via the nozzle 249b and is exhausted from the exhaust pipe 231.

By supplying the DS gas to the wafer 200, Si contained in the DS can be bonded to the dangling bond of Si formed by performing step 1 at the bottom portion of the recess to form a nucleus (seed) of Si. This growth is an epitaxial growth under a processing condition which will be described later. Furthermore, Si contained in the DS can be adsorbed to the Si adsorption site formed by performing step 1 at the side portion and the top portion of the recess to form a seed of Si. This growth is an amorphous growth under a processing condition which will be described later.

Thereafter, the valve 243b is closed to stop the supply of the DS gas. Then, the interior of the process chamber 201 is exhausted according to the same processing procedures as those of step 1. At this time, the supply of the $N_2$ gas into the process chamber 201 is maintained. The $N_2$ gas acts as a purge gas.

(Performing a Predetermined Number of Times)

Figure 5B:
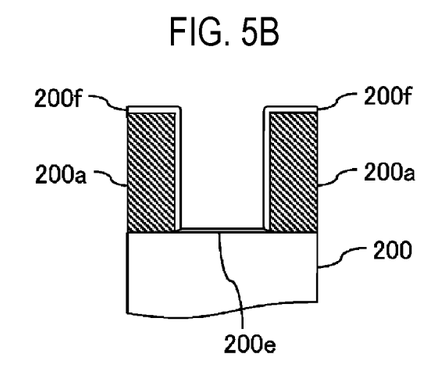
FIG. 5B is a cross sectional view illustrating a surface structure of a wafer after the seed step is completed.

A cycle which alternately performs steps 1 and 2 described above is implemented a predetermined number of times (n times) (where n is an integer of 1 or more). Thus, as illustrated in FIG. 5B, a seed layer 200e can be formed at the bottom portion of the recess, and a seed layer 200f can be formed at the side portion and the top portion of the recess. The seed layer 200e is made of a single crystal Si (epitaxial Si) inheriting the crystallinity of its base, and becomes a continuous layer densely covering the bottom portion of the recess. The seed layer 200f is made of amorphous Si and becomes a continuous layer densely covering the side portion and the top portion of the recess.

Hereinafter, the processing conditions of the seed step will be exemplified. The following conditions are also conditions that enable epitaxial growth of the seed layer 200e and amorphous growth of the seed layer 200f.

The supply flow rate of each of the DCS gas and the DC gas may be set at a flow rate which falls within a range of, for example, 10 to 1,000 sccm. The supply time period of each of the DCS gas and the DC gas may be set at a time period which falls within a range of, for example, 0.5 to 10 minutes. The supply flow rate of the $N_2$ gas supplied from each gas supply pipe may be set at a flow rate which falls within a range of, for example, 100 to 10,000 sccm.

The temperature (seeding temperature) of the wafer 200 may be set at a temperature which falls within the range of, for example, 350 to 450 degrees C. The internal pressure (seeding pressure) of the process chamber 201 may be set at a pressure which falls within a range of, for example, 1 to 1,000 Pa.

If the seeding temperature is less than 350 degrees C. or the seeding pressure is less than 1 Pa, there may be a case where the action of the DCS gas and the DS gas described above is insufficient and thus it is difficult to form the seed layers 200e and 200f. By setting the seeding temperature to become 350 degrees C. or higher or by setting the seeding pressure to become 1 Pa or more, the seed layers 200e and 200f can be formed.

If the seeding temperature exceeds 450 degrees C. or the seeding pressure exceeds 1,000 Pa, there may be a case where Si contained in DCS is deposited at the bottom portion of the recess before the natural oxide film is removed, and the amorphous growth proceeds. There may also be a case where it becomes difficult to proceed in breaking the Si—O bond by DCS at the side portion and the top portion of the recess making it hard to form the seed layer 200f. These problems can be solved by setting the seeding temperature at 450 degrees C. or lower or by setting the seeding pressure at 1,000 Pa or less.

The number of cycles which alternately perform steps 1 and 2 may be set to be the number of times which falls within a range of, for example, 1 to 20 times. The thickness of each of the seed layers 200e and 200f may be set at a thickness which falls within a range of, for example, 1 to 50 Å.

As the first precursor gas, it may be possible to use, in addition to the DCS gas, a chlorosilane precursor gas containing Cl such as a monochlorosilane ($SiH_3Cl$, abbreviation: MCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas or the like.

As the second precursor gas, it may be possible to use, in addition to the DS gas, a silicon hydride gas expressed by a chemical formula $Si_nH_{2n+2}$ (where n is an integer of 1 or more) such as an MS gas, a trisilane ($Si_3H_8$, abbreviation: TS) gas, a tetrasilane ($Si_4H_{10}$) gas, a pentasilane ($Si_5H_{12}$) gas, a hexasilane ($Si_6H_{14}$) gas or the like.

As the inert gas, it may be possible to use, in addition to the $N_2$ gas, for example, a rare gas such as an Ar gas, a He gas, a Ne gas, a Xe gas or the like.

(First Film Forming Step)

After the seed step is completed, the temperature of the wafer 200 is set as a film-forming temperature and the internal pressure of the process chamber 201 is set as a film-forming pressure. FIG. 4 illustrates an example in which the film-forming temperature is a temperature higher than the seeding temperature and the film-forming pressure is a pressure equal to the seeding pressure. Thereafter, an MS gas and a PH gas are supplied to the wafer 200. At this step, the opening/closing control of the valves 243b to 243d is performed in the same procedure as the opening/closing control of the valves 243a, 243c and 243d at step 1 described above to allow the MS gas to flow through the gas supply pipe 232b. The flow rate of the MS gas flowing through the gas supply pipe 232b is adjusted by the MFC 241b. The MS gas is supplied into the process chamber 201 via the nozzle 249b and is exhausted from the exhaust pipe 231. Furthermore, at this time, the valve 243a is opened to allow the PH gas to flow through the gas supply pipe 232a. The flow rate of the PH gas is adjusted by the MFC 241a. The PH gas is supplied into the process chamber 201 via the nozzle 249a and is exhausted from the exhaust pipe 231. At this time, the MS gas and the PH gas are supplied together to the wafer 200.

Figure 5C:
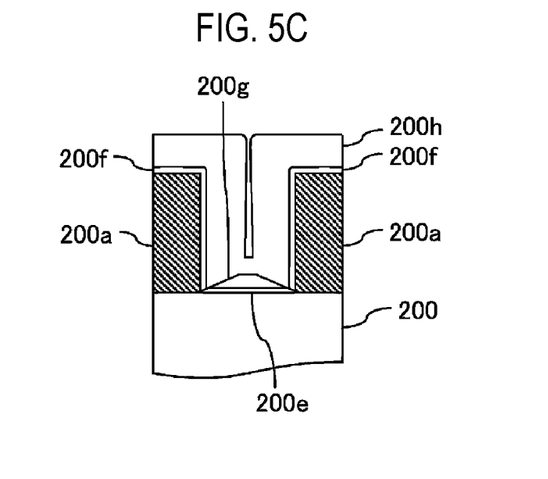
FIG. 5C is a cross sectional view illustrating a surface structure of a wafer after a first film forming step is completed.

By supplying the MS gas and the PH gas to the wafer 200, it is possible to grow a Si film 200g on the seed layer 200e at the bottom portion of the recess. This growth is an epitaxial growth under a processing condition which will be described later. Similar to the seed layer 200e, the crystal structure of the Si film 200g becomes a single crystal inheriting the crystallinity of its base. It is also possible to grow a Si film 200h on the seed layer 200f at the side portion and the top portion of the recess. This growth is an amorphous growth under a processing condition which will be described later. Similar to the seed layer 200f, the crystal structure of the Si film 200h becomes amorphous. By supplying the PH gas together with the MS gas, the P component can be added to each of the Si films 200g and 200h to form these films as doped Si films.

By continuously performing the aforementioned processing, as illustrated in FIG. 5C, a top portion of the Si film 200g is covered with the Si film 200h grown from the side portion of the recess. Thus, the epitaxial growth of the Si film 200g is stopped. In this state, a laminated structure obtained by laminating the Si film 200h on the Si film 200g is formed within the recess, namely on the wafer 200. The Si film 200g is formed at an interface between the wafer 200 and the Si film 200h.

By further continuously performing the aforementioned processing, at least a surface side (opening side) of the recess is blocked by the Si film 200h. That is, the surface side of the recess is blocked by the Si film 200h grown to overhang from the side portion and the top portion of the recess. At this step, however, there may be a case where an unfilled region (void or seam) extending in a depth direction within the recess is generated. If the surface side of the recess is blocked before the interior of the recess is completely filled up by the Si film 200h, the MS gas may not reach the interior of the recess (because the growth of the Si film 200h within the recess is stopped), generating a void within the recess. The void is easier to generate as an aspect ratio of the recess (depth of recess/width of recess) increases, specifically, as the aspect ratio is equal to or greater than 1, for example, equal to or greater than 20, or equal to or greater than 50.

When the surface side of the recess is blocked by the Si film 200h, the valves 243b and 243a are closed to stop the supply of the MS gas and the PH gas into the process chamber 201, respectively. Then, the interior of the process chamber 201 is exhausted according to the same processing procedures as those of step 1 described above. At this time, the supply of the $N_2$ gas into the process chamber 201 is maintained. The $N_2$ gas acts as a purge gas. The supply of the MS gas and the PH gas may be stopped before or after the surface side of the recess is completely blocked by the Si film 200h.

Hereinafter, the processing conditions of the first film forming step will be exemplified. The following conditions are also conditions that enable epitaxial growth of the Si film 200g and amorphous growth of the Si film 200h.

The supply flow rate of the MS gas may be set at a flow rate which falls within a range of, for example, 10 to 2,000 sccm. The supply flow rate of the PH gas is set such that the P concentration in the Si films 200g and 200h is equal to a concentration within a range of, for example, $1.0 \times 10^{21}$ to $1.0 \times 10^{22}$ atoms/cm$^3$, and may be set at a flow rate which falls within a range of, for example, 1 to 1,000 sccm. The supply time period of each of the MS gas and the PH gas may be set at a time period which falls within a range of, for example, 20 to 400 minutes. The supply flow rate of the $N_2$ gas supplied from each gas supply pipe may be set at a flow rate which falls within a range of, for example, 100 to 10,000 sccm.

The temperature (film-forming temperature) of the wafer 200 may be set at a temperature which falls within a range of, for example, 450 to 550 degrees C. The internal pressure (film-forming pressure) of the process chamber 201 may be set at a pressure which falls within a range of, for example, 1 to 900 Pa.

If the film-forming temperature is less than 450 degrees C. or the film-forming pressure is less than 1 Pa, there may be a case where MS becomes difficult to be decomposed making it hard to form the Si films 200g and 200h. By setting the film-forming temperature to become 450 degrees C. or higher or by setting the film-forming pressure to become 1 Pa or more, it is possible to promote the decomposition of MS and to allow the formation of the Si films 200g and 200h to proceed at a practical rate.

If the film-forming temperature exceeds 550 degrees C. or the film-forming pressure exceeds 900 Pa, there may be a case where the behavior of decomposition of MS becomes severe and thus the film thickness uniformity and step coverage of the Si films 200g and 200h deteriorate. Furthermore, there may be a case where the amount of particles generated in the process chamber 201 increases to lower the quality of the film forming process. By setting the film-forming temperature at a temperature of 550 degrees C. or lower or by setting the film-forming pressure at a pressure of 900 Pa or less, these problems can be solved by relaxing the behavior of decomposition of the MS gas.

As the third precursor gas, it may be possible to use, in addition to the MS gas, the aforementioned silicon hydride gas or chlorosilane precursor gas. In order to avoid the residual of Cl in the Si films 200g and 200h, it is desirable to use the silicon hydride gas as the third precursor gas, and in order to increase the deposition rate of the Si films 200g and 200h, it is desirable to use the chlorosilane precursor gas as the third precursor gas.

As the dopant gas, it may be possible to use, in addition to the PH gas, a gas containing P or arsenic (As) such as an arsine ($AsH_3$) gas or the like, i.e., a gas containing an element of group 15 as the dopant. Furthermore, as the dopant gas, it may be possible to use a gas containing boron (B) such as a diborane ($B_2H_6$) gas, a trichloroborane ($BCl_3$) gas or the like, i.e., a gas containing an element of group 13 as the dopant.

As the inert gas, it may be possible to use, in addition to $N_2$ gas, a rare gas as mentioned above.

(First Hydrogen Purge Step)

After the first film forming step is completed, an $H_2$ gas is supplied to the wafer 200. At this step, the valves 243c and 243d are opened to allow the $H_2$ gas to flow through the gas supply pipes 232c and 232d. The flow rate of the $H_2$ gas is adjusted by the MFCs 241c and 241d. The $H_2$ gas is supplied into the process chamber 201 via the gas supply pipes 232a and 232b, and the nozzles 249a and 249b and is exhausted from the exhaust pipe 231. At this time, the $H_2$ gas is supplied to the wafer 200. By supplying the $H_2$ gas to the wafer 200, the surface of the Si film 200h formed on the wafer 200 can be terminated with hydrogen to clean the entire surface.

Thereafter, the valves 243c and 243d are closed to stop the supply of the $H_2$ gas into the process chamber 201. At this time, the interior of the process chamber 201 is exhausted by the vacuum pump 246 while opening the APC valve 244. At this time, the $N_2$ gas may be supplied into the process chamber 201. The $N_2$ gas acts as a purge gas.

The supply flow rate of the $H_2$ gas supplied from each gas supply pipe may be set at a flow rate which falls within a range of, for example, 500 to 3,000 sccm. The supply time period of the $H_2$ gas may be set at a time period which falls within a range of 30 to 120 minutes. The temperature (first hydrogen purge temperature) of the wafer 200 is a temperature equal to the film-forming temperature mentioned above, and may be set at a temperature which falls within a range of, for example, 450 to 550 degrees C. The internal pressure (first hydrogen purge pressure) of the process chamber 201 may be at a pressure which falls within a range of, for example, 500 to 2,000 Pa.

(Etching Step)

After the first hydrogen purge step is completed, an HCl gas is supplied to the wafer 200. At this step, the valve 243a is opened to allow the HCl gas to flow through the gas supply pipe 232a. The flow rate of the HCl gas is adjusted by the MFC 241a. The HCl gas is supplied into the process chamber 201 via the nozzle 249a and is exhausted from the exhaust pipe 231. At this time, the HCl gas is supplied to the wafer 200. The valves 243c and 243d are closed, and the supply of the $N_2$ gas into the process chamber 201 is not performed.

Figure 5D:
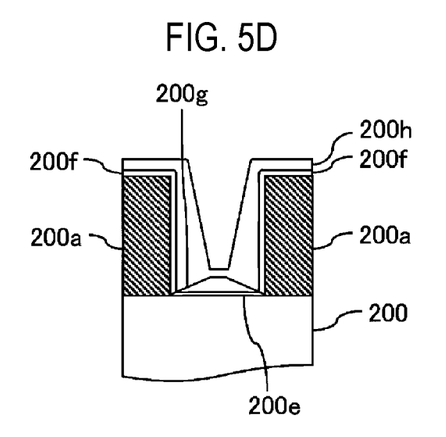
FIG. 5D is a cross sectional view illustrating a surface structure of a wafer after an etching step is completed.

By supplying the HCl gas to the wafer 200, it is possible to etch a portion of the Si film 200h formed on the wafer 200. By removing the portion blocking the surface side of the recess in the Si film 200h, a top portion of the void formed therebelow is opened to expose the void. In this state, an etching process may be continuously performed for a predetermined period of time to etch the Si film 200h constituting an inner wall (sidewall or bottom portion) of the void so as to expand the opening. The supply amount of the HCl gas into the void is gradually reduced from the surface side toward the bottom portion. Thus, as illustrated in FIG. 5D, the longitudinal-sectional shape of the void has a V shape or a reversed trapezoidal shape whose opening width gradually increases from the bottom portion toward the surface side. By forming the exposed void in such a shape, it is possible to promote the supply of the MS gas into the exposed void at a second film forming step which will be described later. As a result, it is possible to completely fill the recess with the Si film, namely so as to turn the recess into a void-free state. Furthermore, this etching process is performed within a proximity in which the Si film 200g covered with the Si film 200h is not exposed, namely within a proximity in which the underlying Si film 200g is not etched. That is, the endpoint of the etching process should be controlled such that only the amorphous Si is exposed to the inner wall of the void and the single crystal Si (epitaxial Si) is not exposed when the etching process is completed.

Thereafter, the valve 243a is closed to stop the supply of the HCl gas into the process chamber 201. At this time, the interior of the process chamber 201 is exhausted by the vacuum pump 246 while opening the APC valve 244. At this time, the $N_2$ gas may be supplied into the process chamber 201. The $N_2$ gas acts as a purge gas.

Hereinafter, the processing conditions of the etching step will be exemplified. The following conditions are also conditions under which the amorphous state of the Si film 200h formed on the wafer 200 is maintained, namely conditions under which the crystallization of the Si film 200h is prevented. That is, the following conditions are conditions under which the Si film 200h is not poly-crystallized (poly-crystallized), and are also conditions under which it is not epitaxialized (monocrystallized). Furthermore, the following conditions are also conditions under which the in-plane uniformity of the etching amount of the Si film 200h is maintained, namely conditions under which the etching amount of the Si film 200h is uniform over the entire in-plane region.

The supply flow rate of HCl gas may be set at a flow rate which falls within a range of, for example, 100 to 10,000 sccm. The supply time period of the HCl gas may be set at a time period which falls within a range of, for example, 10 to 60 minutes.

The temperature (etching temperature) of the wafer 200 is a temperature equal to the film-forming temperature mentioned above, and may be set at a temperature which falls within a range of, for example, 450 to 550 degrees C. The internal pressure (etching pressure) of the process chamber 201 may be set at a pressure higher than the film-forming pressure mentioned above, and may be set at a pressure which falls within a range of, for example, 1,000 to 50,000 Pa, preferably 10,000 to 40,000 Pa, more preferably 20,000 to 30,000 Pa.

If the etching pressure is less than 1,000 Pa under the aforementioned etching temperature, there may be a case where it is difficult to proceed with the etching process or the in-plane uniformity of the etching amount deteriorates. By setting the etching pressure at a pressure of 1,000 Pa or more under the aforementioned etching temperature, it is possible to improve the in-plane uniformity of the etching amount by allowing the etching process to proceed at a practical rate. By setting the etching pressure at a pressure of 10,000 Pa or more, it is possible to reliably increase the etching rate and to further improve the in-plane uniformity of the etching amount. By setting the etching pressure at a pressure of 20,000 Pa or more, these effects can be more reliably achieved.

If the etching pressure exceeds 50,000 Pa under the aforementioned etching temperature, there may be a case where the etching process progresses excessively making it difficult to realize the shape control at the time of void shaping and the endpoint control of the etching process described above. By setting the etching pressure at a pressure of 50,000 Pa or less under the aforementioned etching temperature, these problems can be solved. By setting the etching pressure at a pressure of 40,000 Pa or less, these problems can be reliably solved. By setting the etching pressure at a pressure of 30,000 Pa or less, these problems can be more reliably solved.

(Second Hydrogen Purge Step)

After the etching step is completed, the $H_2$ gas is supplied into the process chamber 201 according to the same processing procedures as those of the first hydrogen purge step. Thus, Cl remaining within the process chamber 201 may be removed from the interior of the process chamber 201. Thereafter, the interior of the process chamber 201 is exhausted according to the same processing procedures as those of the first hydrogen purge step. At this time, the $N_2$ gas may be supplied into the process chamber 201. The $N_2$ gas acts as a purge gas. The supply time period of the $H_2$ gas may be set at a time period which falls within a range of 10 to 60 minutes. Other processing conditions may be similar to the processing conditions of the first hydrogen purge step.

(Second Film Forming Step)

After the second hydrogen purge step is completed, an MS gas and a PH gas are supplied to the wafer 200 according to the same processing procedures as those of the first film forming step. The supply time period of each of the MS gas and the PH gas may be set at a time period which falls within a range of, for example, 10 to 300 minutes. Other processing conditions may be similar to the processing conditions of the first film forming step.

Figure 5E:
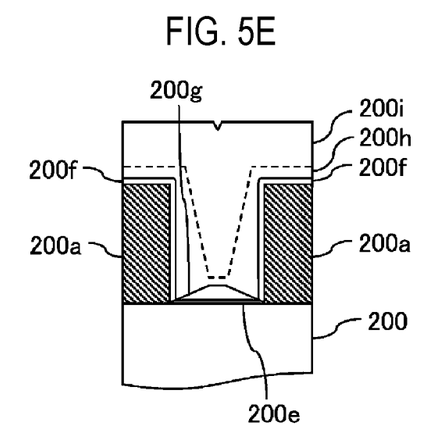
FIG. 5E is a cross sectional view illustrating a surface structure of a wafer after a second film forming step is completed.

By supplying the MS gas and the PH gas to the wafer 200, as illustrated in FIG. 5E, it is possible to grow an Si film 200*i* on the wafer 200, namely on the surface of the Si film 200*h* after the etching process. Similar to the Si film 200*h*, the Si film 200*i* also becomes a doped Si film doped with P. As described above, the processing conditions of the second film forming step may be similar to the processing conditions of the first film forming step except for the gas supply time period. In addition, the epitaxial Si is not exposed to the inner wall of the void whose opening is expanded, and only the amorphous Si is exposed. Thus, similar to the growth of the Si film 200*h*, the growth of the Si film 200*i* is an amorphous growth. The surface of the Si film 200*h* is covered with the Si film 200*i* in an amorphous state. In addition, the void is completely filled to a void-free state by the Si film 200*i* in the amorphous state.

Thereafter, the valves 243*a* and 243*b* are closed to stop the supply of the MS gas and the PH gas into the process chamber 201, respectively. Then, the interior of the process chamber 201 is exhausted according to the same processing procedures as those of step 1 described above. At this time, the supply of the $N_2$ gas into the process chamber 201 is maintained. The $N_2$ gas acts as a purge gas.

(After Purge and Atmospheric Pressure Return)

After the second film forming step is completed, the $N_2$ gas is supplied from each of the gas supply pipes 232*c* and 232*d* into the process chamber 201 and is exhausted from the exhaust pipe 231. The $N_2$ gas acts as a purge gas. Thus, the interior of the process chamber 201 is purged with an inert gas, and the gas or the reaction byproduct, which remains within the process chamber 201, is removed from the interior of the process chamber 201 (after purge). Thereafter, the internal atmosphere of the process chamber 201 is substituted by the inert gas (inert gas substitution). The internal pressure of the process chamber 201 is returned to atmospheric pressure (atmospheric pressure return).

(Boat Unloading and Wafer Discharging)

The seal cap 219 is moved down by the boat elevator 115 to open the lower end of the reaction tube 203. Then, the processed wafers 200 held on the boat 217 are unloaded from the lower end of the reaction tube 203 to the outside of the reaction tube 203 (boat unloading). The processed wafers 200 are discharged from the boat 217 (wafer discharging).

(3) Effects According to the Present Embodiment

According to the present embodiment, one or more effects as set forth below may be achieved.

(a) By using the HCl gas as the etching gas, it is possible to perform an etching process on the Si film 200*h* although the etching temperature is set at a temperature (a temperature within a range of 450 to 550 degrees C.) equal to the film-forming temperature. This makes it possible to improve the productivity of substrate processing.

The reason is because, in the case of using a chlorine ($Cl_2$) gas as the etching gas, it is necessary to set the etching temperature at a temperature of, for example, about 350 degrees C., in order to etch the Si film 200*h*. In this case, it is necessary to provide a temperature falling step in which the internal temperature of the process chamber 201 falls by 100 degrees C. or higher and there is a delay until the temperature is stabilized, between the first film forming step and the etching step. Furthermore, it is necessary to provide a temperature rising step in which the internal temperature of the process chamber 201 rises by 100 degrees C. or higher and there is a delay until the temperature is stabilized, between the etching step and the second film forming step.

In contrast, in the present embodiment, since the series of steps from the first film forming step to the second film forming step may be performed under the same temperature, it is not necessary to provide the temperature falling step or temperature rising step between those steps. Thus, since the sequence of the substrate processing may be simplified or the total time required for the substrate processing may be shortened, it is possible to improve the productivity of the substrate processing.

(b) By performing the etching process under a temperature at which the amorphous state of the Si film 200*h* is maintained, it is possible to maintain a state in which the etching rate of the Si film 200h is high.

The reason is because, if the etching process is performed under a temperature which exceeds 550 degrees C., for example, a temperature within a range of 800 to 1,300 degrees C.) higher than the aforementioned etching temperature, there may be a case where the Si film 200h is crystallized, namely the crystal state of the Si film 200h is changed, lowering the etching rate. Moreover, if a portion of the Si film 200h is locally crystallized, there may be a case where the etching rate of the crystallized portion is lowered more than that of other portions, forming unevenness on the surface of the Si film 200h after the etching. As a result, the surface roughness of the Si film (the laminated film including the Si film 200h or the Si film 200i) finally formed on the wafer 200 may deteriorate, namely the surface smoothness of the film may deteriorate.

In contrast, in the present embodiment, since the etching process is performed under a temperature at which the amorphous state of the Si film 200h is maintained, namely under a low temperature at which the crystal state of the Si film 200h is not changed, it is possible to maintain a high etching rate. Furthermore, it is possible to maintain good surface roughness as well as enhancing the in-plane film thickness uniformity of the finally formed Si film.

(c) By performing the etching process under a pressure higher than the film-forming pressure, for example, under a pressure within a range of, preferably 1,000 to 50,000 Pa, more preferably 10,000 to 40,000 Pa, even more preferably 20,000 to 30,000 Pa, it is possible to effectively perform the etching on the Si film 200h. Furthermore, it is possible to maintain the in-plane uniformity of the etching amount, and to maintain good surface roughness as well as enhancing the in-plane film thickness uniformity of the finally formed Si film.

(d) By doping P in the Si film 200h and setting the P concentration at a concentration within a range of, for example, $1.0 \times 10^{21}$ to $1.0 \times 10^{22}$ atoms/cm$^3$, it is possible to increase the etching rate of the Si film 200h using the HCl gas. This makes it possible to shorten the total time required for the substrate processing and to improve the productivity of the substrate processing.

(e) By performing the etching step without etching the underlying Si film 200g, it is possible to maintain a high etching rate. Moreover, it is possible to maintain good surface roughness as as well as enhancing the in-plane film thickness uniformity of the finally formed Si film. Furthermore, it is possible to maintain a state in which the Si film 200g is not exposed to the outermost surface of the wafer 200 and to amorphous-grow the Si film 200i at the second film forming step. Since the amorphous growth has a growth rate greater than the growth rate of the epitaxial growth, it is possible to shorten the total time required for the substrate processing and to improve the productivity of the substrate processing. It is also possible to avoid the generation of a void again due to a difference in the growth rate of the Si film 200i within the recess whose shape is adjusted by performing the etching process.

(f) By performing the first hydrogen purge step before the etching step, it is possible to clean the surface of the Si film 200h to thereby improve the efficiency of the etching process performed later or improve the in-plane uniformity of the etching amount. Moreover, by performing the second hydrogen purge step after the etching step, it is possible to increase the efficiency of removing Cl from the interior of the process chamber 201 to thereby enhance the quality of the Si film 200i formed later.

(g) Since the seed step of alternately supplying the DCS gas and the DS gas is performed before the first film forming step, it is possible to effectively perform the film forming process of the Si films 200g and 200h, or to improve the quality of these films or the in-plane film thickness uniformity.

(h) The effects mentioned above can be similarly achieved in the case where a halosilane precursor gas other than the DCS gas is used as the first precursor gas, or in the case where a silicon hydride gas other than the DS gas is used as the second precursor gas, or in the case where a silicon hydride gas other than the MS gas is used as the third precursor gas, or in the case where a gas other than the PH gas is used as the dopant gas.

(4) Exemplary Modifications

The film forming sequence of the present embodiment is not limited to the one as illustrated above but may be modified as in the modifications described below.

Modification 1

The P concentration of the Si film 200h formed before performing the etching step may be set higher than the P concentration of the Si film 200i formed after performing the etching step. For example, the P concentration in the Si film 200h may be set at a concentration which falls within a range of $3.0 \times 10^{21}$ to $1.0 \times 10^{22}$ atoms/cm$^3$, and the P concentration in the Si film 200i may be set at a concentration which falls within a range of $1.0 \times 10^{21}$ to $2.0 \times 10^{21}$ atoms/cm$^3$. For example, this may be realized by setting the supply flow rate of the PH gas at the first film forming step to fall within a range of 600 to 1,000 sccm and by setting the supply flow rate of the PH gas at the second film forming step to fall within a range of 1 to 500 sccm, or by setting the supply flow rate or partial pressure of the PH gas at the first film forming step greater than the supply flow rate or partial pressure of the PH gas at the second film forming step. In this manner, by setting the P concentration in the Si film 200h to be etched sufficiently, for example, higher than the P concentration in the Si film 200i, it is possible to increase the effect of improving the aforementioned etching rate.

Modification 2

The Si film 200i formed after performing the etching step may be a non-doped Si film without doping P. For example, the P concentration in the Si film 200h may be set at a concentration which falls within a range of $1.0 \times 10^{21}$ to $1.0 \times 10^{22}$ atoms/cm$^3$ and the Si film 200i may be a non-doped Si film. In this manner, the same effect of improving the aforementioned etching rate may be achieved by setting the P concentration in the Si film 200h to be etched sufficiently, for example, higher than the P concentration in the Si film 200i.

Modification 3

By increasing the supply flow rate or partial pressure of the PH gas during the first film forming step, the P concentration in a portion of the Si film 200h, which is the surface side to be etched, may be set higher than the P concentration in other portions (portions of a lower layer than the surface). For example, this may be realized by starting the first film forming step by setting the supply flow rate of the PH gas at 1 to 500 sccm, and changing the supply flow rate of the PH gas to 600 to 1,000 sccm during the first film forming step. In this manner, it is possible to further increase the effect of improving the aforementioned etching rate, particularly by increasing the P concentration in the portion of the Si film $200h$ to be etched.

Modification 4

The implementation of any one of the first hydrogen purge step and the second hydrogen purge step may be omitted. Furthermore, the implementation of each of these steps may be omitted.

Other Embodiments of the Present Disclosure

While one embodiment of the present disclosure has been specifically described above, the present disclosure is not limited to the aforementioned embodiment but may be differently modified without departing from the spirit of the present disclosure.

Process recipes used in substrate processing may be prepared individually according to the contents of substrate processing and may be stored in the memory device $121c$ via a telecommunication line or the external memory device 123. Moreover, at the start of substrate processing, the CPU $121a$ may properly select an appropriate recipe from a plurality of recipes stored in the memory device $121c$ according to the contents of substrate processing. Thus, it is possible for a single substrate processing apparatus to form films of different film kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, e.g., a case where films are formed using a single-wafer-type substrate processing apparatus capable of processing a single substrate or several substrates at a time. In addition, in the aforementioned embodiment, there has been described an example in which films are formed using a substrate processing apparatus provided with a hot-wall-type processing furnace. The present disclosure is not limited to the aforementioned embodiment but may be appropriately applied to a case where films are formed using a substrate processing apparatus provided with a cold-wall-type processing furnace. In the case of using these substrate processing apparatuses, a film forming process may be performed by the processing sequences and processing conditions similar to those of the embodiment and modifications described above. Effects similar to those of the embodiment and modifications described above may be achieved.

The Si film formed by the method of the aforementioned embodiment may be suitably used for applications such as the formation of contact plugs by filling contact holes.

The embodiment and modifications described above may be appropriately combined with one another. In addition, the processing conditions used at this time may be similar to, for example, those of the aforementioned embodiment.

Examples

Next, experimental results supporting the effects achieved from the aforementioned embodiment and modifications will be described.

An Si film was formed on a wafer by performing the seed step and the first film forming step of the film forming sequence illustrated in FIG. 4 using the aforementioned substrate processing apparatus. The P concentration in the Si film was set at $7.0 \times 10^{20}$, $1.0 \times 10^{21}$, and $2.1 \times 10^{21}$ atoms/cm$^3$. Then, the surface of the Si film was etched by performing the etching step of the film forming sequence illustrated in FIG. 4. The etching pressure was set as 20,000 and 30,000 Pa. Other processing conditions were set to conditions within the range of the conditions mentioned in the aforementioned embodiment.

Figure 6:
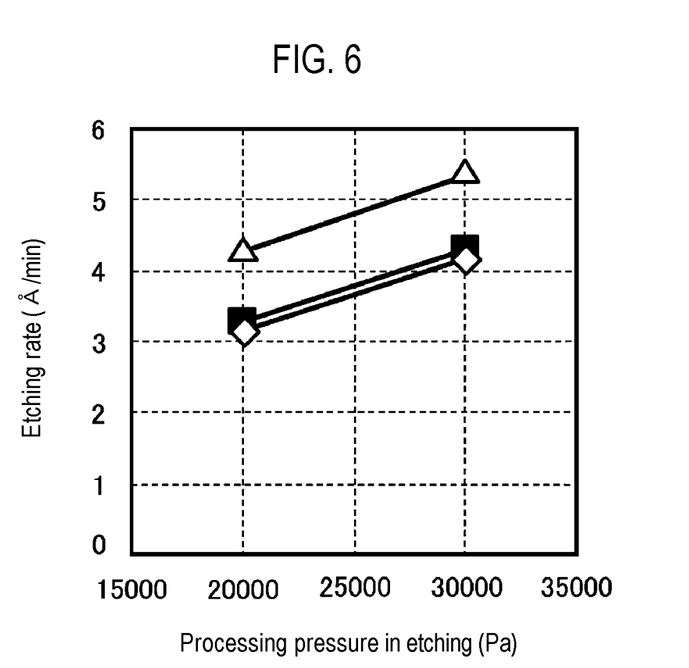
FIG. 6 is a diagram illustrating an evaluation result of an etching rate.

FIG. 6 is a diagram illustrating an evaluation result of the etching rate. In the drawing, the horizontal axis represents an etching pressure (Pa) and the vertical axis represents an etching rate (A/min). In the drawing, the marks ◇, ■, ∆ and indicate data of the Si film in which the P concentrations are $7.0 \times 10^{20}$, $1.0 \times 10^{21}$, and $2.1 \times 10^{21}$ atoms/cm$^3$, respectively. According to FIG. 6, it can be seen that the practical etching rate is obtained, regardless of P concentration and etching pressure. Moreover, it can be seen that it is possible to increase the etching rate of the Si film as the P concentration increases and as the etching pressure increases.

According to the present disclosure in some embodiments, it is possible to improve a quality of an Si film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   forming a first amorphous silicon film on a substrate in a process chamber; and
   etching a portion of the first amorphous silicon film to form an opening in the first amorphous silicon film by using a hydrogen chloride gas under a temperature at which an amorphous state of the first amorphous silicon film is maintained, in the process chamber; and
   forming a second amorphous silicon film on the partially etched first amorphous silicon film to fill the opening, in the process chamber.

2. The method of claim 1, wherein in the act of etching the portion of the first amorphous silicon film, an internal pressure of the process chamber is set higher than an internal pressure of the process chamber when the first amorphous silicon film is formed.

3. The method of claim 1, wherein in the act of etching the portion of the first amorphous silicon film, an internal pressure of the process chamber is set at a pressure under which uniformity of an etching amount of the first amorphous silicon film is maintained.

4. The method of claim 1, wherein in the act of etching the portion of the first amorphous silicon film, an internal pressure of the process chamber is set at 1,000 to 50,000 Pa.

5. The method of claim 1, wherein in the act of etching the portion of the first amorphous silicon film, an internal pressure of the process chamber is set at 10,000 to 40,000 Pa.

6. The method of claim 1, wherein in the act of etching the portion of the first amorphous silicon film, an internal pressure of the process chamber is set at 20,000 to 30,000 Pa.

7. The method of claim 1, wherein the first amorphous silicon film is a film doped with a dopant.

8. The method of claim 7, wherein each of the first amorphous silicon film and the second amorphous silicon film is a film doped with a dopant, and a dopant concentration in the first amorphous silicon film is set higher than a dopant concentration in the second amorphous silicon film.

9. The method of claim 7, wherein the first amorphous silicon film is a film doped with a dopant and the second amorphous silicon film is a film doped with no dopant.

10. The method of claim 7, wherein a dopant concentration in the first amorphous silicon film is set at $1.0 \times 10^{21}$ to $1.0 \times 10^{22}$ atoms/cm$^3$.

11. The method of claim 1, further comprising supplying a hydrogen-containing gas to the substrate in the process chamber before performing the act of etching the portion of the first amorphous silicon film.

12. The method of claim 1, further comprising supplying a hydrogen-containing gas into the process chamber after performing the act of etching the portion of the first amorphous silicon film.

13. The method of claim 1, wherein a single crystal silicon and an insulating film are exposed on a surface of the substrate.

14. The method of claim 1, wherein a recess is provided on a surface of the substrate, a bottom portion of the recess is made of a single crystal silicon, and a side portion of the recess is made of an insulating film.

15. The method of claim 14, wherein in the act of forming the first amorphous silicon film, an epitaxial silicon film is formed at an interface between the first amorphous silicon film and the single crystal silicon, and
in the act of etching the portion of the first amorphous silicon film, the portion of the first amorphous silicon film is etched without etching the epitaxial silicon film.

16. The method of claim 1, wherein the act of forming the first amorphous silicon film and the act of forming the second amorphous silicon film are performed under the same temperature as the temperature in the act of etching the portion of the first amorphous silicon film.

17. The method of claim 1, wherein at least a single crystal silicon is exposed on a surface of the substrate,
in the act of forming the first amorphous silicon film, an epitaxial silicon film is formed at an interface between the first amorphous silicon film and the single crystal silicon, and
in the act of etching the portion of the first amorphous silicon film, the portion of the first amorphous silicon film is etched without etching the epitaxial silicon film.

* * * * *